United States Patent [19]
Wada et al.

[11] Patent Number: 4,508,578
[45] Date of Patent: Apr. 2, 1985

[54] METHOD OF MANUFACTURING FINE FILAMENTARY NB-TI BASED ALLOY SUPERCONDUCTING WIRE

[75] Inventors: Hitoshi Wada, Toride; Kyoji Tachikawa, Tokyo; Yutaka Yamada, Kawasaki; Satoru Murase, Yokohama, all of Japan

[73] Assignees: National Research Institute, Tokyo; Tokyo Shibaura Denki Kabushiki Kaisha, Kawasaki, both of Japan

[21] Appl. No.: 556,099

[22] Filed: Nov. 29, 1983

[30] Foreign Application Priority Data

Nov. 29, 1982 [JP] Japan ............................ 57-207642

[51] Int. Cl.$^3$ ............................................ H01L 39/12
[52] U.S. Cl. .................................... 148/11.5 F; 29/599
[58] Field of Search ............................ 148/11.5 F, 133; 29/599

[56] References Cited

U.S. PATENT DOCUMENTS

| | | | |
|---|---|---|---|
| 3,514,850 | 6/1970 | Barber et al. | 29/599 |
| 3,616,530 | 11/1971 | Chester | 29/599 |
| 3,715,243 | 2/1973 | Clayton et al. | 29/599 |
| 3,837,066 | 9/1974 | Mori et al. | 29/599 |

OTHER PUBLICATIONS

IEEE Transactions on Magnetics, vol. MAG-17, No. 1, pp. 53-56, Jan. 1981.

Primary Examiner—W. Stallard
Attorney, Agent, or Firm—Oblon, Fisher, Spivak, McClelland & Maier

[57] ABSTRACT

A method of manufacturing a fine multifilamentary Nb-Ti based superconducting wire was disclosed, which comprises a first step of processing an alloy consisting essentially of 10 to 50 atomic % of niobium, 40 to 75 atomic % of titanium and no higher than 30 atomic % of least one element selected from a group consisting of hafnium, tantalum and tungsten to form an alloy wire, a second step of covering said alloy wire with a stabilizer, cold drawing the resultant wire, bundling a plurality of stabilizer-clad wires thus obtained, covering the bundle of wires with a stabilizer, and extruding and cold drawing the resultant bundled wire to thereby form a multifilamentary wire, and a third step of thermally treating the resultant multifilamentary wire at a temperature of 250° to 600° C. and drawing the resultant treated multifilamentary wire to a reduction rate of 30 to 99.9%. The third step is carried out more than once.

12 Claims, 7 Drawing Figures

METHOD OF MANUFACTURING FINE FILAMENTARY NB-TI BASED ALLOY SUPERCONDUCTING WIRE

BACKGROUND OF THE INVENTION

This invention relates to improvements in a method of manufacturing a fine multi-filamentary Nb-Ti based superconducting wire consisting of a Nb-Ti alloy containing one or more metal elements selected from a group consisting of hafnium, tantalum and tungsten.

Heretofore, superconducting wires have been thought to be used at 4.2 K. (i.e., the boiling temperature of helium at 1 atm.), and their properties only at 4.2 K. have been significant. Accordingly, it has been a main practical idea to use Nb-Ti binary alloy wires as superconducting wires for magnets providing magnetic field of at most 8 or 9 teslas while using compound wires of $Nb_3Sn$ or $V_3G_a$ having satisfactory properties as superconducting wires for magnets providing magnetic field in a range of 9 to 13 teslas.

However, in accordance with increase in size and magnetic field intensity of the superconducting magnet, the superconducting wire is subject to a greater electromagnetic force, with the result that the stress damage done to the properties of the compound superconducting wire has become a serious problem. On the other hand, marked progress has been achieved recently in the field of cooling technique, e.g., pressurized superfluid helium cooling under pressure, making it possible to achieve a temperature less than 4.2 K. easily. Under the circumstances, the technique of adding another element to a Nb-Ti superconducting wire and using said superconducting wire under temperatures lower than 4.2 K., particularly, within a superfluid helium temperature range, has come to attract attentions in this field as a measure for solving the stress damage problem and obtaining a magnet generating a high magnetic field. The NbTi based alloy has a superior stress tolerance, and there is a theoretical forecast that addition of heavy elements such as hafnium, tantalum and tungsten to a Nb-Ti alloy permits an upper critical magnetic field higher than that of Nb-Ti binary alloy to be attained in the superfluidity temperature range of helium, and extensive experiments have been conducted on bulk materials of such alloys. High superconducting performance properties, however, cannot be obtained by merely thermally treating Nb-Ti based alloys as noted above, and there has been a demand for establishing a method of manufacturing a Nb-Ti based superconducting wire having a sufficiently high current carrying capacity as practical superconducting wire.

SUMMARY OF THE INVENTION

An object of the invention is to provide a method of manufacturing a fine multifilamentary Nb-Ti based superconducting wire having superior superconducting properties, e.g., critical current, to those of the prior art Nb-Ti wires.

The method of manufacturing a fine multifilamentary Nb-Ti based superconducting wire according to the invention consists of three distinct steps.

In the first step, a Nb-Ti based alloy is prepared by adding one or more elements selected from a group consisting of hafnium, tantalum and tungsten in an amount not exceeding 30 atomic % to a Nb-Ti alloy composed of 10 to 50 atomic % of niobium and 40 to 75 atomic % of titanium. An alloy wire is then formed from the resultant alloy by such process as extrusion and/or drawing. The amounts of the components of the alloy are set in the ranges noted above for the following reasons. If the amount of niobium is below 10 atomic % or above 50 atomic %, a superconducting wire having a sufficiently high critial temperature and upper critical magnetic field cannot be obtained. From these standpoints, a more preferable range of the amount of niobium is 15 to 40 atomic %. As for titanium, if its amount is below 40 atomic %, fine precipitates which are necessary for increasing the critical current cannot be formed in the alloy. On the other hand, the amount of titanium in excess of 75 atomic % deteriorates the workability of the alloy. A more preferable range of the amount of titanium is 45 to 75%. As for the additive element, if its amount exceeds 30 atomic %, the workability of the alloy is extremely deteriorated and the critical current thereof is reduced. There is no particular lower limit on its amount, but the amount is preferably above 0.5 atomic % more preferably 0.5 to 20 atomic %, to obtain a superconducting wire having sufficiently high upper critical magnetic field in the superfluidity temperature of helium.

In the second step, the alloy wire obtained in the first step is covered with a stabilizer, and the resultant wire is subjected to extrusion and/or cold drawing. A plurality of, e.g. several hundred to tens of thousand, the stabilizer-clad alloy wires thus obtained are bundled, the resultant bundle being covered again with a stabilizer, the resultant composite being subjected to extrusion and/or drawing to obtain a multifilamentary wire. Additional processes of covering with stabilizer and extrusion and/or drawing may be carried out repeatedly until a predetermined diameter of the filament is obtained.

In the third step, the multifilamentary wire obtained in the second step is thermally treated at a temperature of 250° to 600° C., more preferably 300° to 500° C., and is then drawn with reduction rate of 30 to 99.9%, thereby obtaining a fine multifilamentary superconducting wire. If necessary, the third step may be repeatedly carried out a plurality of times. The reduction rate D is given as $$D = \frac{S_1 - S_2}{S_1} \times 100 \, (\%)$$

where
$S_1$: Sectional area of wire before drawing
$S_2$: Sectional area of wire after drawing The reason for setting the temperature of the thermal treatment in the third step to 250° to 600° C. is as follows. If it is below 250° C., precipitates cannot be formed in the alloy at a density necessary to obtain sufficiently high critial current. If it exceeds 600° C., the precipitates grow larger to result in the reduction of the critical current. The thermal treatment may be carried out in an inert gas atmosphere or vacuum for 2 to 1,000 hours.

The drawing process with a reduction rate of 30 to 99.9% in the third step will introduce a number of dislocations into the alloy structure, which, together with the precipitates formed by the thermal treatment, have an effect of markedly improving the critical current in the neighborhood of the upper critical magnetic field. In consequence, the superconducting wire will exhibit excellent critical current properties in a high magnetic field when it is used in a temperature range below 2.2 K., i.e., the superfluidity temperature range of helium. The reason for setting the reduction rate to 30 to 99.9% is as follows. If it is below 30%, insufficient dislocations are introduced into the alloy structure. Increasing it beyond 99.9% results in pronounced breakage of filaments. The drawing in the third step may be done either as cold or warm drawing. When cold drawing is done, greater number of dislocations can be introduced into the alloy structure, improving the critical current per filament. In case of carrying out warm drawing, though the dislocations are slightly reduced, the breakage of filaments during the drawing process can be reduced, which is advantageous from the standpoint of the yield. The warm drawing is preferably carried out at a temperature of 300° C. or less. If the temperature exceeds 300° C., the dislocations introduced by the warm drawing are prominently reduced so that sufficient improvement of the critical current cannot be obtained. In case when the third step is carried out a plurality of times, the drawing may be carried out as a combination of cold and warm drawing processes.

Further, in the drawing in the third step, the temperature of the multifilamentary wire is extremely elevated when the wire passes through the drawing die. This temperature rise results in reduction of dislocations. To avoid this, it is desirable to cool the wire after drawing down to a temperature below room temperature. The cooling may be done by immersing the wire immediately after the drawing in ice water, dry-ice, liquid nitrogen, etc. This prevents the reduction of dislocations and improves the critical current.

Further, by carrying out the extrusion or drawing in the first and second steps with a reduction ratio of $10^3$ to $10^6$ a large number of dislocations can be introduced into the alloy structure, thus permitting a further improvement of the critical current. If the reduction ratio is below $10^3$, the number of dislocations is insufficient. The dislocations are further reduced by the thermal treatment in the third step. If it exceeds $10^6$, breakage of filaments during the drawing in the third step is extremely increased.

DETAILED DESCRIPTION OF THE PREFERRED EMBODIMENT

Figure 1:
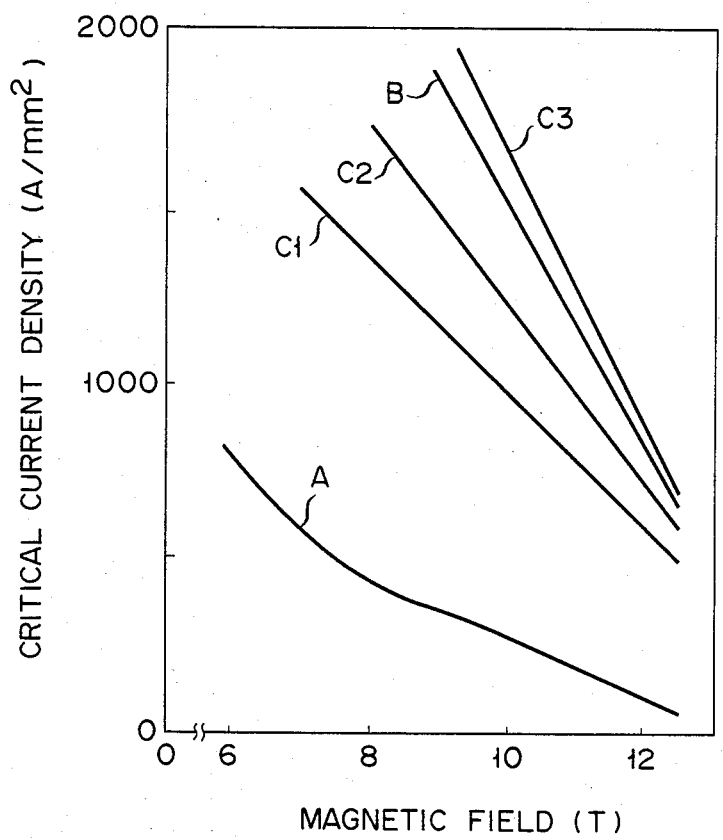
FIG. 1 is a graph showing the relationship between critical current density and magnetic field of fine multifilamentary Nb-Ti-Hf superconducting wires at a temperature of 1.8 K.

The invention will now be described in detail in conjunction with some examples.

EXAMPLE 1

Nine different kinds of alloy rods (with a diameter of 30 mm), three rods of each kind and a total of 27 rods, having respective compositions as shown in the Table below were produced (first step).

Then, each alloy rod was inserted into a copper tube (i.e., stabilizer) with an outer diameter of 40 mm, and the resultant copper-clad rod was cold-drawn. A number of copper-clad wires are thus prepared. 295 such copper-clad wires were then inserted into a copper tube with an outer diameter of 50 mm, and the resultant system was subjected to hydraulic extrusion and cold drawing, thereby obtaining a multifilamentary wire with an outer diameter of 8 mm. At this moment, the reduction ratio of the filament was about $10^4$ (second step).

The individual multifilamentary wires were than subjected to the third step under conditions listed in the Table below, thereby obtaining 27 different fine multifilamentary Nb-Ti based superconducting wires. As for the conditions of the step 3 as shown in the Table, the samples 1A to 9A were subjected to the sole thermal treatment, the samples 1B to 9B were subjected to a process consisting of thermal treatment and cold drawing three times, and the samples 1C to 9C were subjected to a process consisting of thermal treatment and warm drawing three times. With the samples 1B to 9B and 1C to 9C, the drawing was carried out from a state, at which the reduction ratio (i.e., the sectional area of the filament before drawing divided by the sectional area of the same after drawing) was about $10^4$ (outer diameter: 8 mm) in the first and second steps, until the reduction ratio was about $10^6$ (outer diameter: 0.8 mm) in the final drawing in the third step. With the samples 1A to 9A, the drawing was done up to a reduction ratio of about $10^6$ (outer diameter: 0.8 mm) in the first and second steps.

With the individual superconducting wires manufactured in the manner as described, the number of filaments broken during the manufacture and the critical current density (i.e., critical current divided by the total sectional area of the filament: A/mm) at a temperature of 1.8 K. and in a magnetic field of 10 teslas were measured. The results are also listed in the Table.

TABLE

| Sample No. | Composition (atomic %) | | | | | Condition for third step | Number of broken filaments | Critical current density (A/mm$^2$) at 1.8 K and in 10-tesla field |
|---|---|---|---|---|---|---|---|---|
| | Nb | Ti | Hf | Ta | W | | | |
| 1A | 35 | 62 | 3 | — | — | HT*[1] | 13 | 300 |
| 1B | | | | | | (HT + CD*[2]) × 3*[4] | 15 | 1550 |
| 1C | | | | | | (HT + WD*[3]) × 3 | 2 | 1700 |
| 2A | 20 | 65 | — | 15 | — | HT | 12 | 460 |
| 2B | | | | | | (HT + CD) × 3 | 15 | 1970 |
| 2C | | | | | | (HT + WD) × 3 | 1 | 2000 |
| 3A | 35 | 60 | — | — | 5 | HT | 15 | 200 |
| 3B | | | | | | (HT + CD) × 3 | 15 | 1500 |
| 3C | | | | | | (HT + CD) × 3 | 3 | 1650 |
| 4A | 25 | 60 | 5 | 10 | — | HT | 17 | 370 |
| 4B | | | | | | (HT + CD) × 3 | 20 | 1720 |
| 4C | | | | | | (HT + WD) × 3 | 5 | 1830 |
| 5A | 20 | 60 | 3 | 15 | 2 | HT | 19 | 300 |
| 5B | | | | | | (HT + CD) × 3 | 25 | 1620 |
| 5C | | | | | | (HT + WD) × 3 | 5 | 1740 |
| 6A | 10 | 60 | 6 | 18 | 6 | HT | 29 | 250 |
| 6B | | | | | | (HT + CD) × 3 | 35 | 1500 |
| 6C | | | | | | (HT + WD) × 3 | 7 | 1670 |
| 7A | 30 | 35 | 10 | 15 | 10 | HT | 100 | 120 |
| 7B | | | | | | (HT + CD) × 3 | 105 | 310 |
| 7C | | | | | | (HT + WD) × 3 | 58 | 380 |
| 8A | 30 | 30 | 20 | 20 | — | HT | 120 | 80 |
| 8B | | | | | | (HT + CD) × 3 | 120 | 240 |
| 8C | | | | | | (HT + WD) × 3 | 65 | 260 |
| 9A | 5 | 55 | 20 | — | 20 | HT | 121 | 50 |
| 9B | | | | | | (HT + CD) × 3 | 126 | 180 |
| 9C | | | | | | (HT + WD) × 3 | 67 | 190 |

Note:
*[1]Thermal treatment at 350° C. for 50 hours
*[2]Cold drawing with reduction rate of 80%
*[2]The symbol (× 3) means that the process in parenthese is carried out three times.

As is obvious from the Table, with Nb-Ti based alloy superconducting wires whose compositions deviate from the range according to the invention (i.e., samples 7A, 7B, 7C, 8A, 8B, 8C, 9A, 9B and 9C) the workability is inferior, with the results that the breakage of filaments is extremely pronounced and the critical current density is low. Particularly, the superconducting wires obtained from these alloys through the third step according to the invention (i.e., samples 7B, 7C, 8B, 8C, 9B and 9C) do not substantially differ in the critical current density value from the superconducting wires obtained through the sole thermal treatment (i.e., samples 7A, 8A and 9A). In contrast, the superconducting wires obtained from the alloys having compositions in the range according to the invention through three times of a combination process consisting of thermal treatment and cold drawing (i.e., samples 1B to 6B) are extremely improved in the critical current density over the superconducting wires, which are obtained through the sole thermal treatment provided on the multifilamentary wires manufactured from the alloys of the same compositions (i.e., samples 1A to 6A), because of introduction of more dislocations into the alloy structure although the breakage of filaments is slightly increased. Further, the superconducting wires obtained from the multifilamentary wires made of alloys of the same compositions by carrying out the combination process consisting of thermal treatment and warm drawing three times (i.e., samples 1C to 6C), are extremely improved in the critical current density because the breakage of filaments is reduced.

EXAMPLE 2

Multifilamentary wires (consisting of 295 filaments) were manufactured from an alloy composed of 35 atomic % of niobium, 62 atomic % of titanium and 3 atomic % of hafnium. These multifilamentary wires were processed in various ways as the third step to obtain five different kinds of fine multifilamentary Nb-Ti-Hf superconducting wires.

With these superconducting wires, changes in the critical current density (A/mm$^2$) with changing magnetic field (in teslas) at a temperature of 1.8 K. were measured. The results of measurements are shown in FIG. 1. Referring to the Figure, line A represents the property of a superconducting wire obtained from a multifilamentary wire, which has been obtained through cold drawing up to a reduction ratio of about 10$^6$ in the second step, through the sole thermal treatment carried out under the same conditions as those with the samples 1A to 9A in Example 1. Line B represents the property of a superconducting wire obtained by carrying out the combination process of thermal treatment and cold drawing three times under the same conditions as with the samples 1B to 9B in Example 1. Lines C$_1$ to C$_3$ represent the properties of superconducting wires obtained by carrying out the combination process of thermal treatment and warm drawing under the same conditions as with the samples 1C to 9C in Example 1 once, twice and three times respectively. As is obvious from FIG. 1, the superconducting wires obtained by carrying out the third step according to the invention (i.e., those of lines B and C$_1$ to C$_3$) are greatly improved in the critical current density compared to the superconducting wire obtained through the sole thermal treatment (i.e., that of line A). Further, among the superconducting wires obtained in the third step according to the invention, the critical current density is more improved as the thermal treatment and drawing are carried out repeatedly.

EXAMPLE 3

Multifilamentary wires (consisting of 295 filaments) were manufactured from an alloy composed of 20 atomic % of niobium, 65 atomic % of titanium and 15 atomic % of tantalum. In the manufactured of these wires, extrusion and drawing were done to a reduction ratio of about $10^4$ in the second step. These wires were subjected to a combination process consisting of thermal treatment at various temperatures for 50 hours and warm drawing up to a reduction rate of 80% at 200° C. The combination process was conducted three times to obtain fine filamentary Nb-Ti-Ta superconducting wires.

Figure 2:
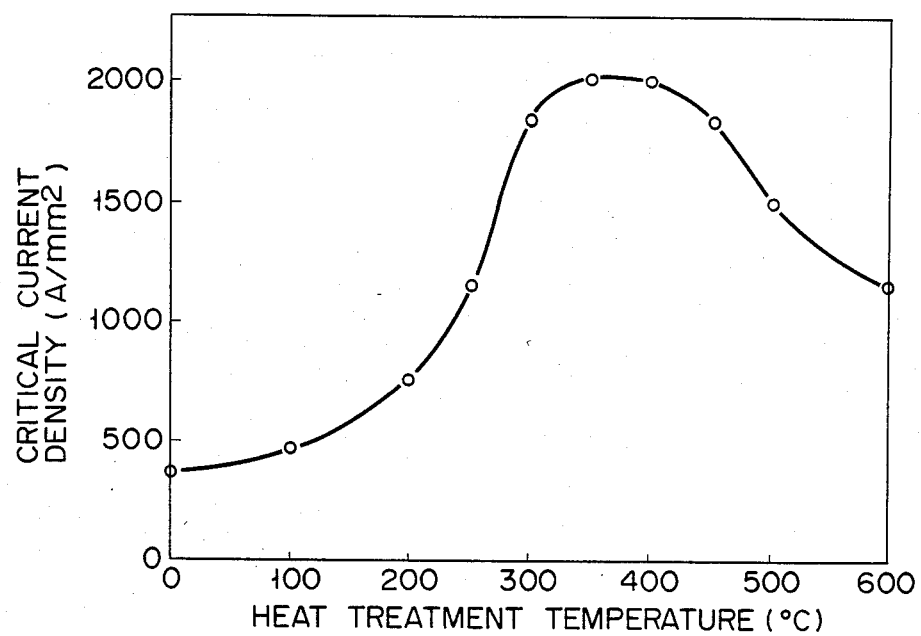
FIG. 2 is a graph showing the relationship between critical current density and temperature of thermal treatment of fine filamentary Nb-Ti-Ta superconducting wires at a temperature of 1.8 K. and in a magnetic field of 10 teslas.

The critical current density of the superconducting wires at a temperature of 1.8 K. and in a magnetic field of 10 teslas was measured, and its temperature dependency on the temperature of the thermal treatment was examined. The results were shown in FIG. 2. as is obvious from the graph of FIG. 2, high critical current density can be obtained when the temperature of the thermal treatment is 250° to 600° C.

EXAMPLE 4

Fine multifilamentary superconducting wires (Nb: 20 atomic %, Ti: 65 atomic %, Ta: 15 atomic %) were produced by the same method as in Example 3 except that the temperature of the thermal treatment was set to 350° C. and the period of thermal treatment was set to various values. The critical current density of the superconducting wires thus obtained was measured at a temperature of 1.8 K. and in a magnetic field of 10 teslas, and its dependency on the temperature of the thermal treatment was examined. The result is shown in FIG. 3.

Figure 3:
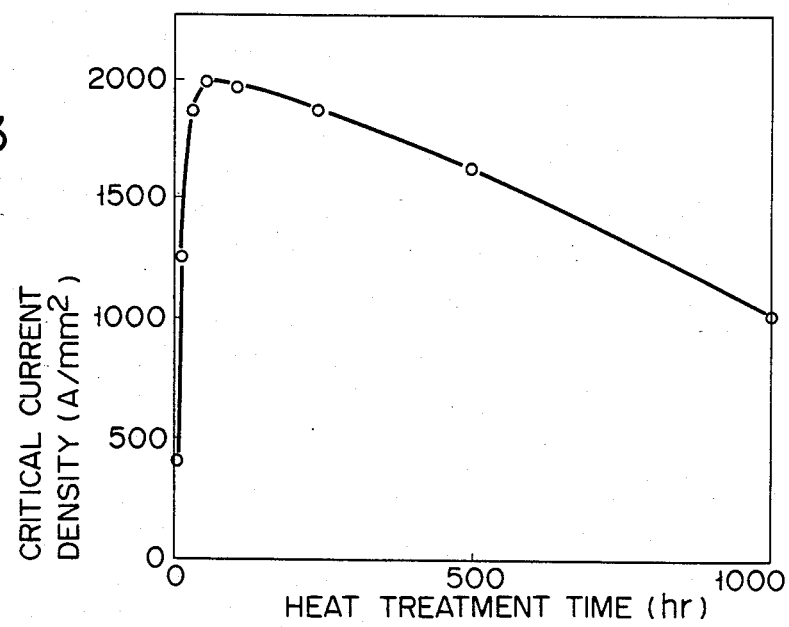
FIG. 3 is a graph showing the relationship between critical current density and time of thermal treatment of fine filamentary Nb-Ti-Ta superconducting wires at a temperature of 1.8 K. and in a magnetic field of 10 teslas.

As is apparent from the graph of FIG. 3, high critical current density can be obtained when the period of the thermal treatment is 2 to 1,000 hours.

EXAMPLE 5

Multifilamentary wires (consisting of 295 filaments) were produced from an alloy composed of 35 atomic % of niobium, 60 atomic % of titanium and 5 atomic % of tungsten by the same method as in Example 1. In the manufacture of these wires, extrusion and drawing to a reduction ratio of about $10^4$ were done in the first and second steps. These wires were subjected to the same third step as in Example 3 except that the temperature of thermal treatment was set to 350° C. and the reduction rate of warm drawing was set to various values, thus obtaining fine multifilamentary superconducting wires. Since the reduction rate was changed in a wide range, the combination process in the third step was carried out only once.

Figure 4:
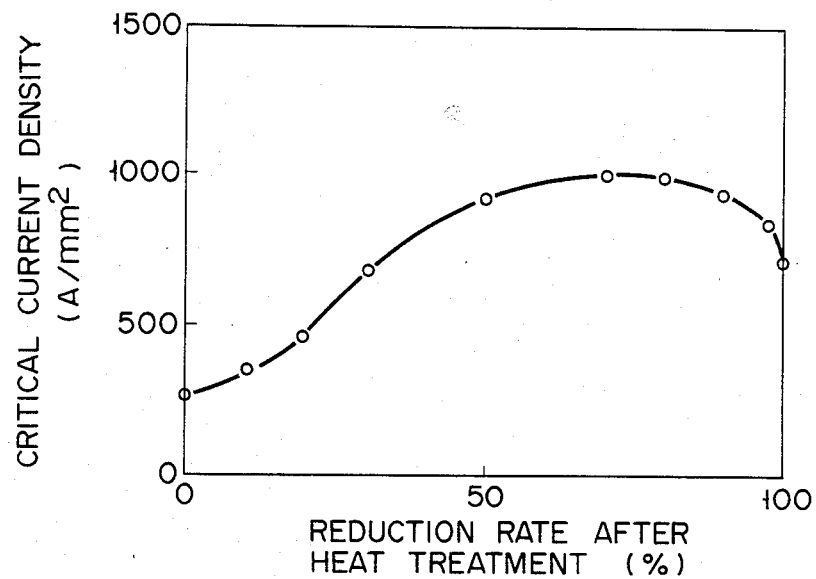
FIG. 4 is a graph showing the relationship between critical current density and reduction rate of warm drawing of fine filamentary Nb-Ti-W superconducting wires at a temperature of 1.8 K. and in a magnetic field of 10 teslas.

The critical current density of the superconducting wires was measured at a temperature of 1.8 K. and in a magnetic field of 10 teslas, and its dependency on the reduction rate of the warm drawing was examined. The results are shown in FIG. 4. As is obvious from the graph of FIG. 4, high critical current density can be obtained when the reduction rate of the warm drawing is 30 to 99.9%. Further, it was confirmed that even in the case of cold drawing high critical current density could be obtained with a reduction rate of 30 to 99.9%.

EXAMPLE 6

Fine multifilamentary superconducting wires (Nb: 35 atomic %, Ti: 60 atomic %, W: 5 atomic %) were produced by the same method as in Example 5 except that the reduction rate of warm drawing was set to 80%, the temperature condition of the warm drawing was set to various values, and the combination process was carried out three times.

Figure 5:
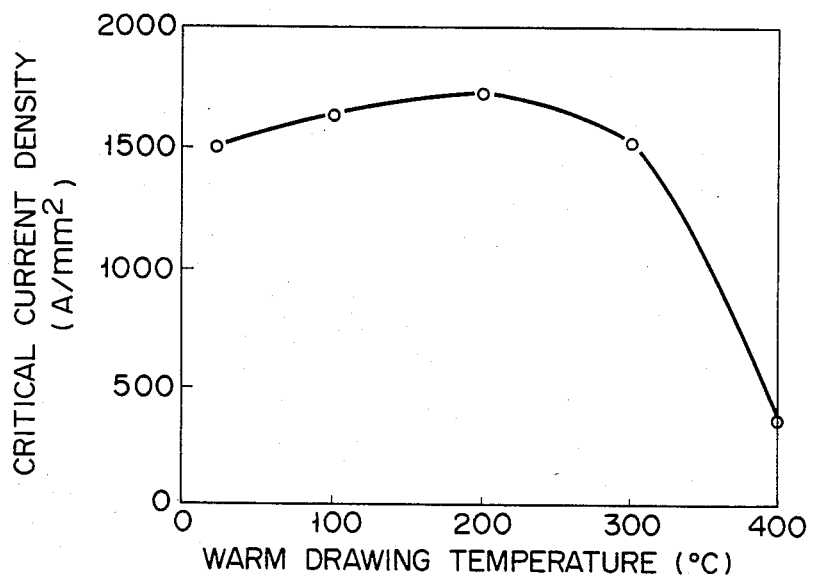
FIG. 5 is a graph showing the relationship between critical current density and temperature of warm drawing of fine filamentary Nb-Ti-W superconducting wires at a temperature of 1.8 K. and in a magnetic field of 10 teslas.
Figure 6:
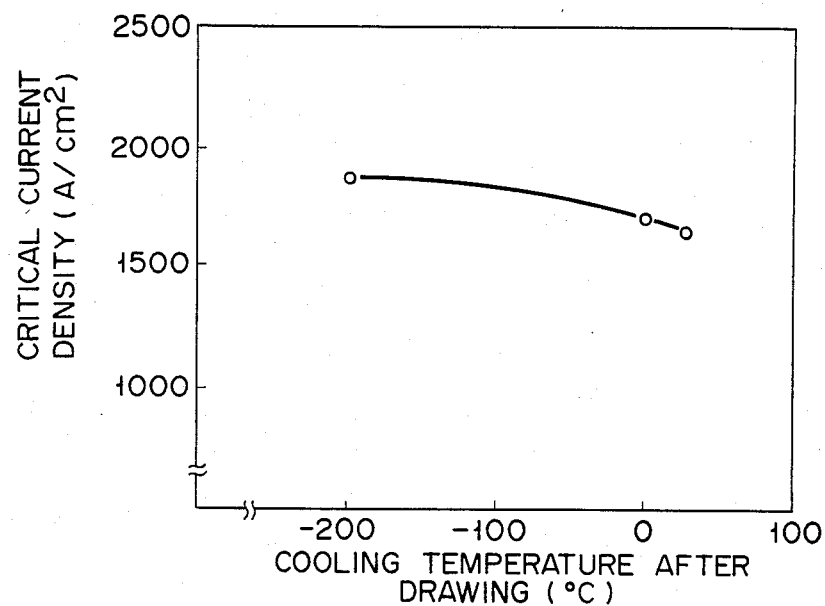
FIG. 6 is a graph showing the relationship between critical current density and temperature of cooling after drawing of fine filamentary Nb-Ti-W superconducting wires at a temperature of 1.8 K. and in a magnetic field of 10 teslas.

The critical current density of the superconducting wires thus obtained was measured at a temperature of 1.8 K. and in a magnetic field of 10 teslas, and its dependency on the temperature of the warm drawing was examined. The results are shown in FIG. 5. As is obvious from FIG. 5, high critical current density could be obtained when the temperature in the warm drawing is 300° C. or less.

EXAMPLE 7

Fine multifilamentary superconducting wires (consisting of 295 filaments, Nb: 35 atomic %, Ti: 60 atomic %, W: 5 atomic %) were obtained in the same manner as in Example 5. In the manufacture, the extrusion and drawing in the first and second steps were done to a reduction ratio of about $10^4$. These wires were subjected to a combination process consisting of thermal treatment at 350° C. and 50 hours and drawing with a reduction rate of 80% with cooling after passing through the die. The combination process was done three times to obtain fine filamentary superconducting wires. The cooling of the wires after passing through the die was carried out under three different conditions, i.e., cooling down to room temperature, cooling down to 0° C. using ice water, and cooling down to −196° C. using liquid nitrogen.

The critical current density of the superconducting wires was measured at a temperature of 1.8 K. and in a magnetic field of 10 teslas, and its dependency on the cooling temperature after passing through the die was examined. The results are shown in FIG. 3. It will be seen from the Figure that the critical current density can be improved by cooling after the drawing in the third step.

EXAMPLE 8

Various multifilamentary wires (each consisting of 295 filaments) were produced from an alloy composed of 20 atomic % of niobium, 65 atomic % of titanium and 15 atomic % of tantalum with the reduction ratio of $10^1$ to $10^6$ in the first and second steps. These wires were subjected to a combination process consisting of thermal treatment at 350° C. for 50 hours and warm drawing with a reduction rate of 50% and at a temperature of 200° C. The combination process was done three times to obtain fine multifilamentary superconducting wires.

Figure 7:
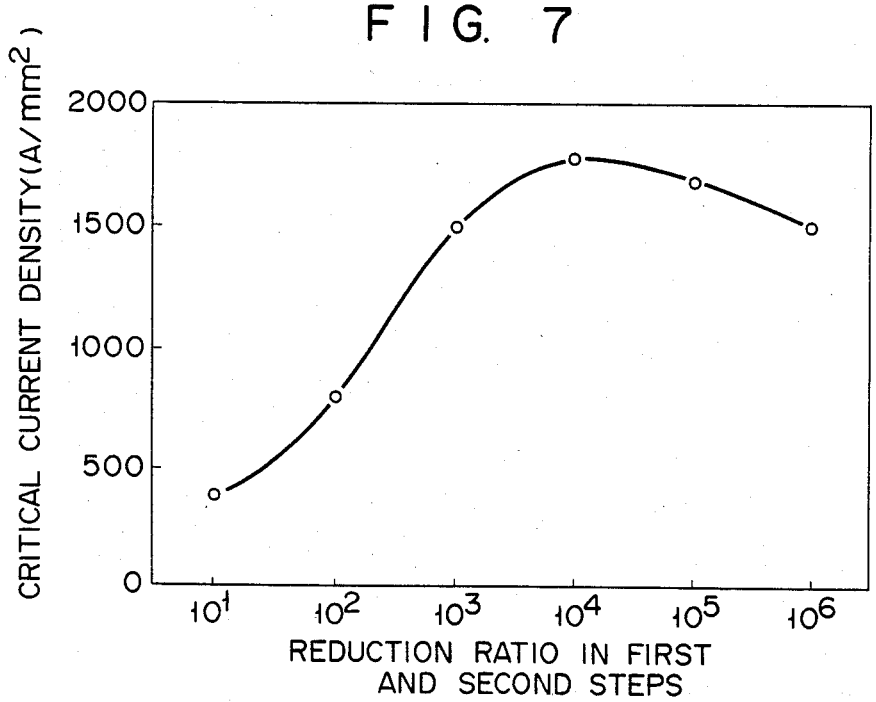
FIG. 7 is a graph showing the relationship between critical current density and reduction ratio before third step of fine filamentary Nb-Ti-Ta superconducting wires at a temperature of 1.8 K. and in a magnetic field of 10 teslas.

The critical current density of the superconducting wires thus obtained were measured at a temperature of 1.8 K. and in a magnetic field of 10 teslas, and its dependency on the reduction ratio of extrusion and drawing in the first and second steps was examined. The results are shown in FIG. 7. As is obvious from the graph of FIG. 7, high critical current density can be obtained when the reduction ratio of extrusion and drawing in the first and second steps is $10^3$ to $10^6$.

As has been described in the foregoing, according to the invention it is possible to obtain a fine multifilamentary Nb-Ti based superconducting wire having far superior critical current properties to those of the prior art Nb-Ti superconducting wires in the superfluidity temperature range of hellium (i.e., no higher than 2.2 K.). It is thus possible to increase the magnetic field and reduce the size of the superconducting magnets. Further, the superconducting wire obtained by the method according to the invention is less subject to deterioration by stress, so that it can be very effectively utilized as large size superconducting magnets used for nuclear fusion reactors and accelerators.

What is claimed is:

1. A method of manufacturing a fine multifilamentary Nb-Ti based superconducting wire comprising:
    a first step of processing an alloy consisting essentially of 10 to 50 atomic % of niobium, 40 to 75 atomic % of titanium and no higher than 30 atomic % of at least one element selected from a group consisting of hafnium, tantalum and tungsten to form an alloy wire;
    a second step of covering said alloy wire with a stabilizer, cold drawing the resultant wire, bundling a plurality of stabilizer-clad wires thus obtained, covering the bundle of wires with a stabilizer, and extruding and cold drawing the resultant bundled wires to thereby form a multifilamentary wire; and
    a third step of thermally treating said multifilamentary wire at a temperature of 250° to 600° C. and drawing the resultant treated filamentary wire to a reduction rate of 30 to 99.9%,
    said third step being carried out more than once.

2. The method according to claim 1, wherein said alloy consists essentially of 15 to 40 atomic % of niobium, 45 to 75 atomic % of titanium and 0.5 to 20 atomic % of an element selected from hafnium, tantalum and tungsten.

3. The method according to claim 1, wherein the drawing in said third step is cold drawing.

4. The method according to claim 1, wherein the drawing in said third step is warm drawing.

5. The method according to claim 4, wherein the temperature of said warm drawing is 300° C. or less.

6. The method according to claim 1, wherein the thermal treatment in said third step is carried out in an inert gas atmosphere or in vacuum.

7. The method according to claim 1, wherein the temperature of the thermal treatment in said third step is 300° to 500° C.

8. The method according to claim 1, wherein said third step is carried out a plurality of times and includes cold drawing and warm drawing.

9. The method according to claim 1, wherein the thermal treatment in said third step is done for 2 to 1,000 hours.

10. The method according to claim 1, wherein the drawing in said third step is accompanied by cooling of the wire immediately after passing through the drawing die.

11. The method according to claim 1, wherein the extrusion and drawing in said first and second steps is done to a reduction ratio of $10^3$ to $10^6$.

12. The method according to claim 1, wherein said stabilizer is made of copper or aluminum.

* * * * *